United States Patent
Chen

(10) Patent No.: US 11,139,345 B2
(45) Date of Patent: Oct. 5, 2021

(54) DISPLAY PANEL, DISPLAY APPARATUS, AND METHOD OF FABRICATING DISPLAY PANEL

(71) Applicant: BOE Technology Group Co., Ltd., Beijing (CN)

(72) Inventor: Liqiang Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 472 days.

(21) Appl. No.: 16/301,519

(22) PCT Filed: Dec. 7, 2017

(86) PCT No.: PCT/CN2017/115083
§ 371 (c)(1),
(2) Date: Nov. 14, 2018

(87) PCT Pub. No.: WO2019/109316
PCT Pub. Date: Jun. 13, 2019

(65) Prior Publication Data
US 2021/0233967 A1    Jul. 29, 2021

(51) Int. Cl.
*H01L 27/32* (2006.01)
*H01L 51/52* (2006.01)
(Continued)

(52) U.S. Cl.
CPC .... *H01L 27/3218* (2013.01); *G02F 1/133388* (2021.01); *G02F 1/133504* (2013.01);
(Continued)

(58) Field of Classification Search
CPC ......... G02F 1/133388; G02F 1/133504; H01L 51/5268
See application file for complete search history.

(56) References Cited

U.S. PATENT DOCUMENTS 8,572,893 B2 * 11/2013 Watanabe ............ G02B 5/0215
49/64
9,985,085 B2 * 5/2018 Yang .................... G09G 3/3208
(Continued)

FOREIGN PATENT DOCUMENTS

CN    105118383 A  * 12/2015  .............. G09F 9/00
CN    105118383 A    12/2015
(Continued)

OTHER PUBLICATIONS

State Intellectual Property Office of the P.R. China, Written Opinion of International Searching Authority, dated Aug. 29, 2018, all pages (Year: 2018).*
(Continued)

*Primary Examiner* — Victoria K. Hall
(74) *Attorney, Agent, or Firm* — Intellectual Valley Law P.C.

(57) ABSTRACT

The present application discloses a display panel having a display area and an array of a plurality of subpixels in the display area. The display panel includes a base substrate and a light diffusion layer on the base substrate. The light diffusion layer includes a plurality of light diffusers separated from each other. Each of the plurality of light diffusers is configured to diffuse light emitted from the one of the plurality of subpixels nearest to an edge of the display area. A portion of diffused light emits out of the each of the plurality of light diffusers outside a region corresponding to the one of the plurality of subpixels nearest to the edge of the display area.

20 Claims, 7 Drawing Sheets

(51) Int. Cl.
*H01L 51/56* (2006.01)
*G02F 1/1335* (2006.01)
*G02F 1/1333* (2006.01)

(52) U.S. Cl.
CPC ...... *H01L 51/5253* (2013.01); *H01L 51/5268* (2013.01); *H01L 51/56* (2013.01)

(56) References Cited

U.S. PATENT DOCUMENTS

| | | | |
|---|---|---|---|
| 10,614,283 B2 * | 4/2020 | He | G06F 3/0412 |
| 10,627,069 B2 * | 4/2020 | Orisich | F21S 41/25 |
| 2002/0135715 A1 * | 9/2002 | Miwa | G02F 1/133553 349/113 |
| 2010/0123384 A1 | 5/2010 | Cok et al. | |
| 2012/0069273 A1 * | 3/2012 | Watanabe | G02B 27/30 349/64 |
| 2013/0026521 A1 * | 1/2013 | Lee | H01L 51/5212 257/98 |
| 2014/0167085 A1 * | 6/2014 | Lee | H01L 51/5275 257/98 |
| 2014/0253419 A1 | 9/2014 | Tanada | |
| 2014/0300840 A1 * | 10/2014 | Fattal | G02F 1/133615 349/15 |
| 2015/0023024 A1 * | 1/2015 | Ohta | F21V 7/0008 362/296.01 |
| 2015/0077835 A1 * | 3/2015 | Yamazaki | G02F 1/1677 359/296 |
| 2015/0285964 A1 * | 10/2015 | Yim | G02B 5/021 359/599 |
| 2015/0301781 A1 * | 10/2015 | Ekkaia | F21V 11/00 362/237 |
| 2016/0049612 A1 * | 2/2016 | Kim | H01L 33/12 257/88 |
| 2016/0178907 A1 * | 6/2016 | Chang | G02B 27/0172 359/599 |
| 2017/0125733 A1 | 5/2017 | Kwon et al. | |
| 2017/0131583 A1 * | 5/2017 | Liu | G02B 30/27 |
| 2017/0186776 A1 | 6/2017 | Kang et al. | |
| 2018/0073700 A1 * | 3/2018 | Orisich | F21S 41/63 |
| 2018/0357979 A1 * | 12/2018 | Nakamura | G09G 5/10 |
| 2019/0271870 A1 * | 9/2019 | Wang | G02F 1/1341 |
| 2020/0132911 A1 * | 4/2020 | Zhang | G02B 6/0061 |
| 2021/0080787 A1 * | 3/2021 | Wang | G02B 5/02 |

FOREIGN PATENT DOCUMENTS

| | | | | |
|---|---|---|---|---|
| CN | 106405723 A | | 2/2017 | |
| JP | H0961634 A | | 3/1997 | |
| JP | 2010134345 A | | 6/2010 | |
| JP | 2012118223 A | | 6/2012 | |
| JP | 2014197179 A | | 10/2014 | |
| JP | 2017084776 A | | 5/2017 | |
| JP | 2017120894 A | | 7/2017 | |
| KR | 20110130177 A | | 12/2011 | |
| KR | 20160141110 A | | 12/2016 | |
| KR | 20160143991 A | | 12/2016 | |
| KR | 1020160141110 | * | 12/2016 | ............... G09F 9/00 |
| WO | WO-2010032596 A1 | * | 3/2010 | ......... H01L 51/5268 |

OTHER PUBLICATIONS

Machine translation, Wei, Chinese Pat. Pub. No. CN 105118383B, translation date: Jul. 14, 2021, Espacenet, all pages. (Year: 2021).*
Machine translation, Kim, Korean Pat. Pub. No. KR 10-2016-0141110A, translation date: Jul. 14, 2021, Espacenet, all pages. (Year: 2021).*
Notice of Grant of Patent in the Korean Patent Application No. 20187034182, dated Jul. 29, 2020; English translation attached.
First Office Action in the Indian Patent Application No. 201837046318, dated Jan. 11, 2021.
First Office Action in the Japanese Patent Application No. 2018564227, dated May 11, 2021; English translation attached.
The Extended European Search Report in the European Patent Application No. 17910497.1, dated May 11, 2021.

* cited by examiner

DISPLAY PANEL, DISPLAY APPARATUS, AND METHOD OF FABRICATING DISPLAY PANEL

CROSS-REFERENCE TO RELATED APPLICATION

This application is a national stage application under 35 U.S.C. § 371 of International Application No. PCT/CN2017/115083, filed Dec. 7, 2017, the contents of which are incorporated by reference in the entirety.

TECHNICAL FIELD

The present invention relates to display technology, more particularly, to a display panel, a display apparatus, and a method of fabricating a display panel.

BACKGROUND

Display panels such as liquid crystal display (LCD) panels and organic light-emitting diode display (OLED) panels have been widely used. In recent years, the display panels have been made in various shapes, e.g., a round shape, a polygonal shape, and a triangular shape.

SUMMARY

In one aspect, the present invention provides a display panel having a display area and an array of a plurality of subpixels in the display area, comprising a base substrate; and a light diffusion layer on the base substrate and comprising a plurality of light diffusers separated from each other; wherein each of the plurality of light diffusers is configured to diffuse light emitted from the one of the plurality of subpixels nearest to an edge of the display area, a portion of diffused light emits out of the each of the plurality of light diffusers outside a region corresponding to the one of the plurality of subpixels nearest to the edge of the display area.

Optionally, each of the plurality of light diffusers comprises a first part and a second part integrated together; a projection of the first part on the base substrate at least partially overlaps with a projection of one of the plurality of subpixels nearest to the edge of the display area on the base substrate; a projection of the second part on the base substrate extends outside the projection of the one of the plurality of subpixels nearest to the edge of the display area on the base substrate; and each of the plurality of light diffusers is configured to diffuse light emitted from the one of the plurality of subpixels nearest to the edge of the display area, a portion of diffused light emits out of the each of the plurality of light diffusers from the second part.

Optionally, the plurality of subpixels along the edge of the display area in at least a first region form a serrated exterior contour; and a plurality of light diffusers nearest to the edge of the display area in the at least the first region form a substantially smooth exterior contour.

Optionally, the substantially smooth exterior contour is a substantially smoothly curved contour.

Optionally, the substantially smooth exterior contour is a substantially straight-line.

Optionally, the projection of the first part on the base substrate substantially overlaps with the projection of the one of the plurality of subpixels nearest to an edge of the display area on the base substrate.

Optionally, a projection of each of the plurality of light diffusers on the base substrate partially overlaps with a projection of a single one of the plurality of subpixels nearest to an edge of the display area on the base substrate.

Optionally, the light diffusion layer comprises a body being substantially transparent and a light diffusing agent dispersed in the body.

Optionally, the body comprises a polymer material; and the light diffusing agent comprises a plurality of light diffusing particles.

Optionally, the plurality of light diffusing particles are made of one or a combination of silicon oxide, poly ethylene propylene, and a silicone resin; and the body is made of one or a combination of polycarbonate and polymethyl methacrylate.

Optionally, the display panel is an organic light emitting diode display panel comprising a plurality of organic light emitting diodes.

Optionally, the display panel further comprises an encapsulating layer encapsulating the plurality of organic light emitting diodes; and the light diffusion layer is on a side of the encapsulating layer distal to the base substrate and in contact with the encapsulating layer.

Optionally, the display panel further comprises an optically clear resin layer on a side of the encapsulating layer distal to the base substrate; and the light diffusion layer is on a side of the optically clear resin layer distal to the base substrate and in contact with the optically clear resin layer.

Optionally, the display panel further comprises a cover glass on a side of the optically clear resin layer distal to the base substrate; and the light diffusion layer is on a side of the cover glass distal to the base substrate and in contact with the cover glass.

Optionally, the display panel is a liquid crystal display panel.

Optionally, the array of a plurality of subpixels is as fanged substantially along a first direction and a second direction; at least a portion of an outline of the display panel extends along a direction non-parallel to the first direction and non-parallel to the second direction; and the plurality of light diffusers are along the outline.

Optionally, an outline of the display panel comprises a portion of a round shape, or a portion of an arc shape, or a portion of a polygonal shape.

In another aspect, the present invention provides a display apparatus comprising the display panel described herein or fabricated by a method described herein.

Optionally, the display apparatus is a smart watch.

In another aspect, the present invention provides a method of fabricating a display panel having a display area and an array of a plurality of subpixels in the display area, comprising forming a light diffusion layer having a plurality of light diffusers on a base substrate; wherein each of the plurality of light diffusers is formed to diffuse light emitted from the one of the plurality of subpixels nearest to the edge of the display area, a portion of diffused light emits out of the each of the plurality of light diffusers outside a region corresponding to the one of the plurality of subpixels nearest to the edge of the display area.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
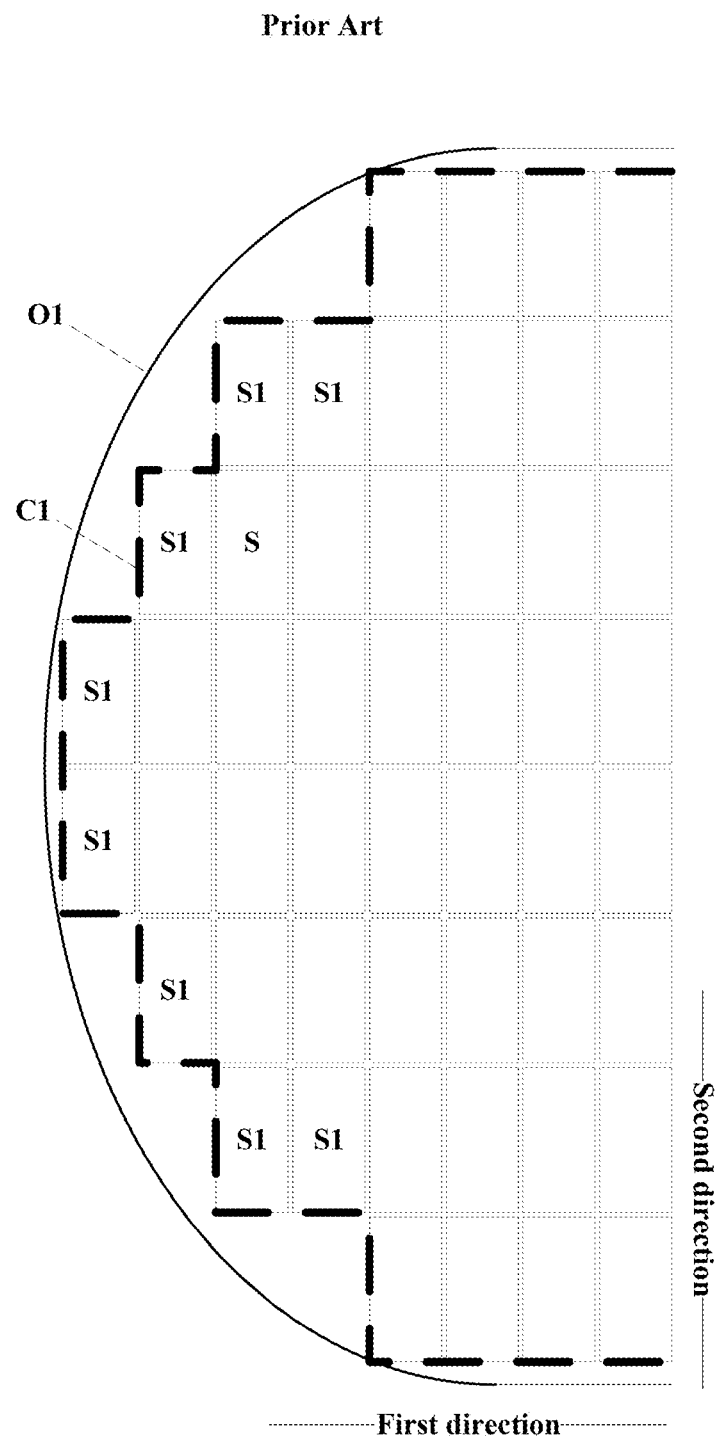
FIG. 1 is a diagram illustrating a portion of a display panel in some embodiments according to the present disclosure.

FIG. 1 is a diagram illustrating a portion of a display panel in some embodiments according to the present disclosure. Referring to FIG. 1, the display panel in some embodiments has outline O1. The outline O1 of the display panel includes at least a portion of a round shape or an arc shape. Further, the display panel includes an array of a plurality of subpixels S arranged substantially along a first direction and a second direction. As shown in FIG. 1, at least a portion of the outline of the display panel extends along a direction which is not parallel to the first direction and is not parallel to the second direction. As a result, the plurality of subpixels nearest to an edge of the display area (annotated as subpixels S1 in FIG. 1) in at least a first region form a serrated exterior contour C1 (depicted in dotted line) Subpixels S1 are a subset of the plurality of subpixels S.

Figure 2:
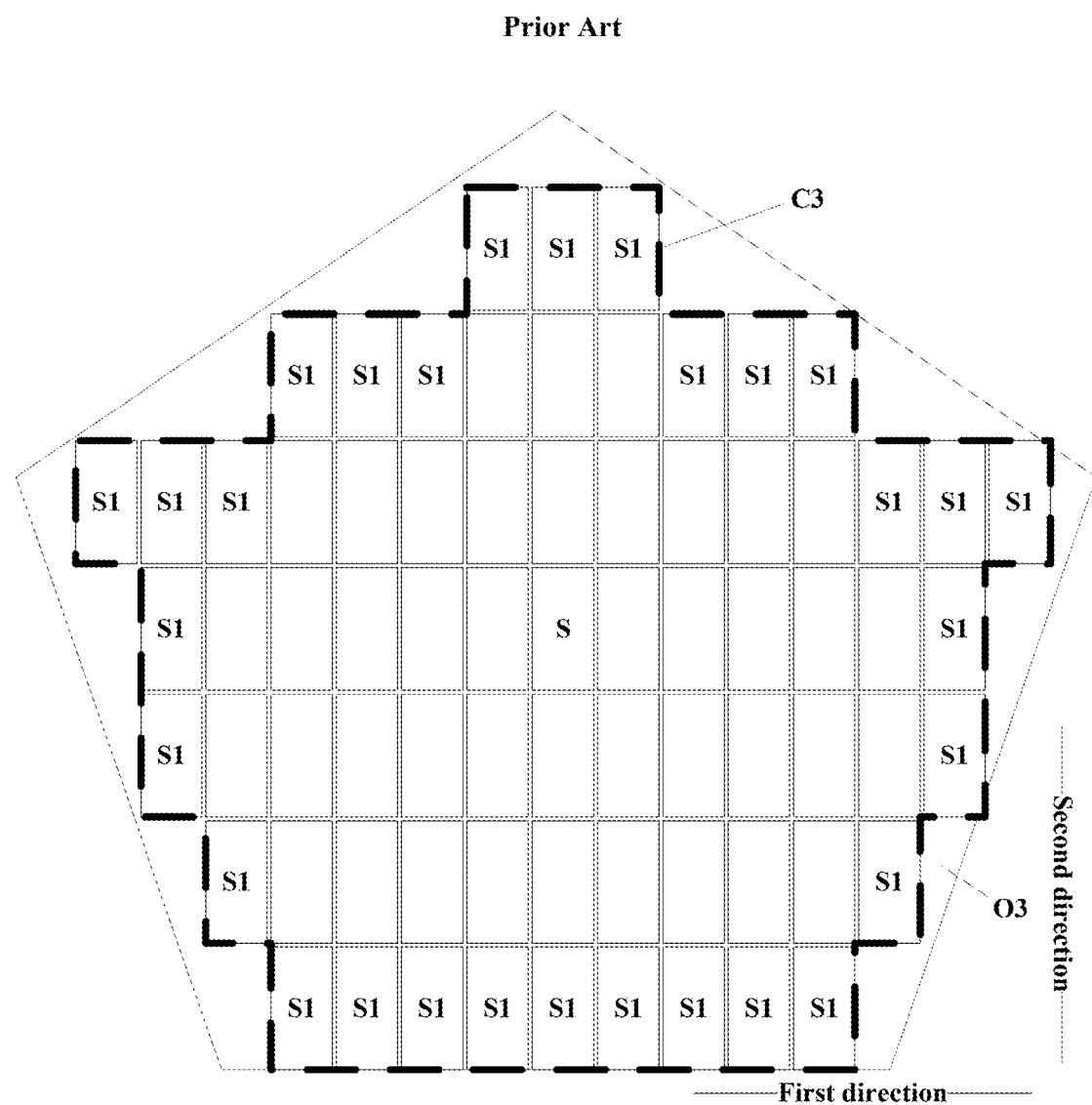
FIG. 2 is a diagram illustrating a portion of a display panel in some embodiments according to the present disclosure.

FIG. 2 is a diagram illustrating a portion of a display panel in some embodiments according to the present disclosure. Referring to FIG. 2, the display panel in some embodiments has a polygonal-shaped outline O3. The outline O3 of the display panel includes at least a portion (e.g., the portion on the right-hand corner) that is not parallel to the first direction and is not parallel to the second direction. As a result, the plurality of subpixels nearest to an edge of the display area (annotated as subpixels S1 in FIG. 2) in at least a first region form a serrated exterior contour C3 (depicted in dotted line). Subpixels S1 are a subset of the plurality of subpixels S.

As used herein, the term "display area" refers to an area of the display panel or display substrate where image is actually displayed. Optionally, the display area may include both a subpixel region and an inter-subpixel region, A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. In one example, the display area in the display panels of FIG. 1 and FIG. 2 includes the area encircled by the serrated exterior contour C1 or serrated exterior contour C3.

The serrated exterior contour severely affects display quality. For example, the image displayed on the display panel appears to have a jagged edge. Moreover, the subpixels S1 nearest to an edge of the display area often display images with color distortion.

Accordingly, the present disclosure provides, inter alia, a display panel, a display apparatus, and a method of fabricating a display panel that substantially obviate one or more of the problems due to limitations and disadvantages of the related art. In one aspect, the present disclosure provides a display panel having a display area and an array of a plurality of subpixels in the display area. In some embodiments, the display panel includes a base substrate; and a light diffusion layer on the base substrate and comprising a plurality of light diffusers separated from each other. Optionally, each of the plurality of light diffusers is configured to diffuse light emitted from the one of the plurality of subpixels nearest to the edge of the display area, a portion of diffused light emits out of the each of the plurality of light diffusers outside a region corresponding to the one of the plurality of subpixels nearest to the edge of the display area. Optionally, each of the plurality of light diffusers includes a first part and a second part integrated together. Optionally, a projection of the first part on the base substrate at least partially overlaps with a projection of one of the plurality of subpixels nearest to an edge of the display area on the base substrate. Optionally, a projection of the second part on the base substrate extends outside the projection of the one of the plurality of subpixels nearest to the edge of the display area on the base substrate. Optionally, each of the plurality of light diffusers is configured to diffuse light emitted from the one of the plurality of subpixels nearest to the edge of the display area, a portion of diffused light emits out of the each of the plurality of light diffusers from the second part.

Figure 3:
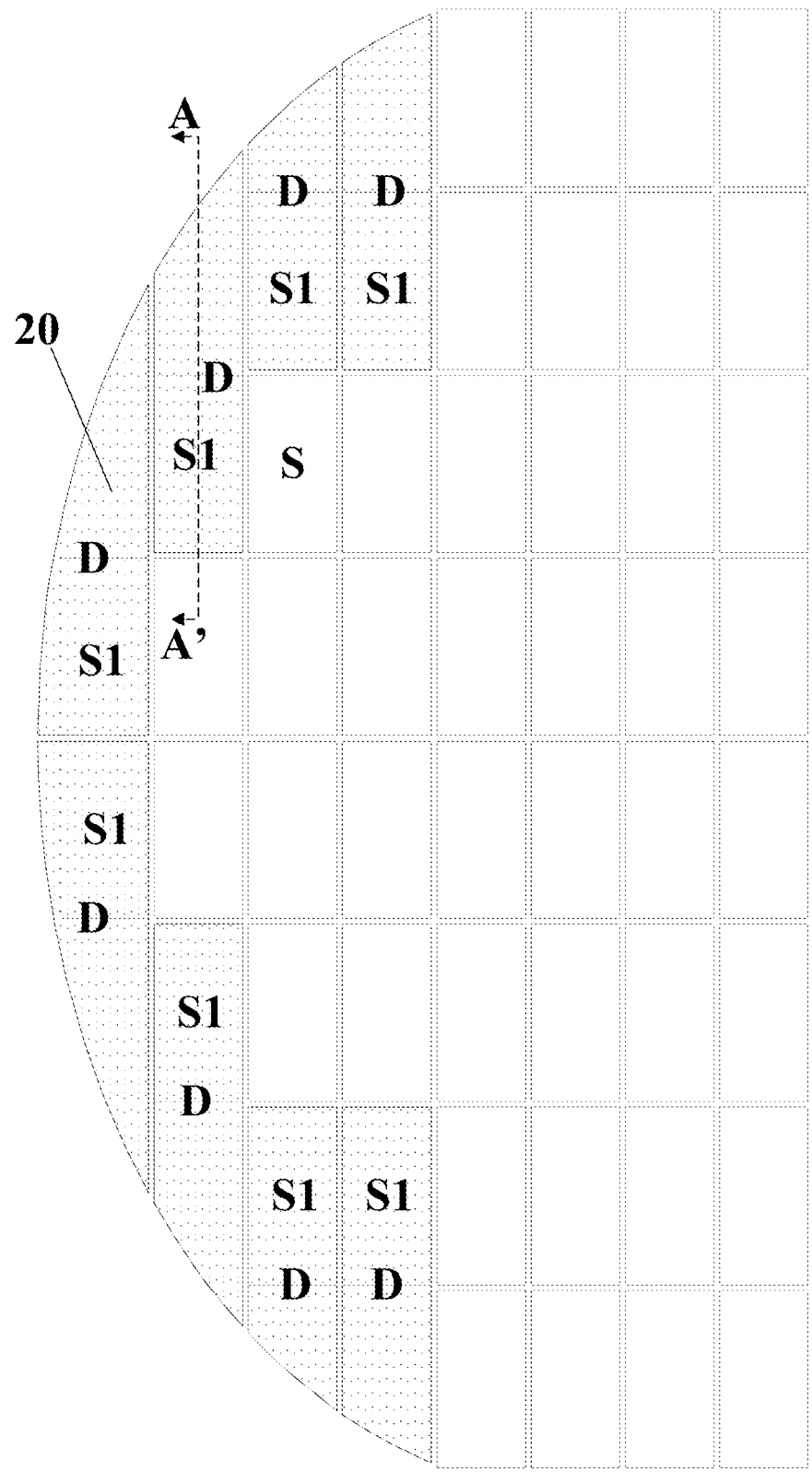
FIG. 3 is a diagram illustrating a portion of a display panel in some embodiments according to the present disclosure.

FIG. 3 is a diagram illustrating a portion of a display panel in some embodiments according to the present disclosure. Referring to FIG. 3, the display panel in some embodiments includes a light diffusion layer 20. The light diffusion layer 20 includes a plurality of light diffusers D. Each of the plurality of light diffusers D is configured to diffuse light emitted from the one of the plurality of subpixels S1 nearest to the edge of the display area. A portion of diffused light emits out of the each of the plurality of light diffusers D outside a region corresponding to the one of the plurality of subpixels S1 nearest to the edge of the display area. For example, a portion of diffused light emits out of the each of the plurality of light diffusers D outside a region encircled by the exterior contour formed by the plurality of subpixels S. The present display panel obviates the issue of the jagged edge in the image displayed in the display panel, and the issue of incorrect color displayed by the plurality of subpixels S1 nearest to the edge of the display area. The image displayed on the present display panel appears to have a substantially smooth edge and true color.

Figure 4:
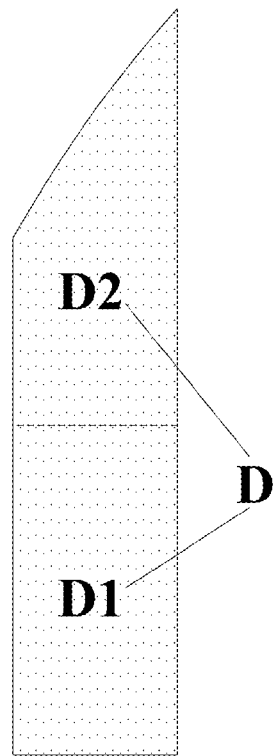
FIG. 4 is a diagram illustrating the structure of a light diffuser in some embodiments according to the present disclosure.
Figure 5:
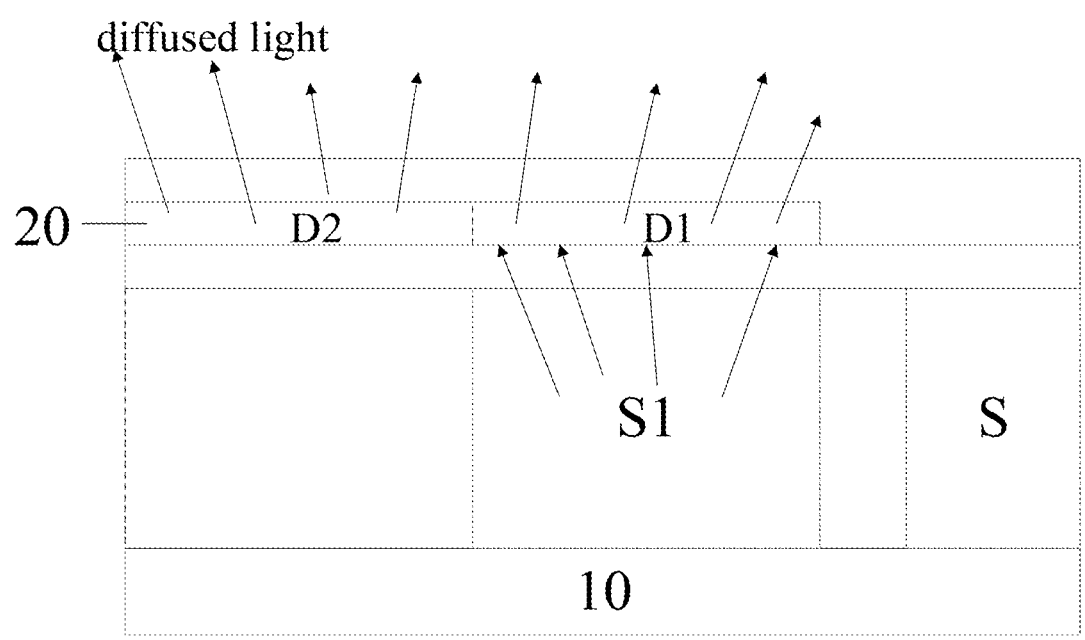
FIG. 5 is cross-sectional view of the display panel along A-A' line in FIG. 3.

FIG. 4 is a diagram illustrating the structure of a light diffuser in some embodiments according to the present disclosure. FIG. 5 is cross-sectional view of the display panel along A-A' line in FIG. 3. Referring to FIG. 4 and FIG. 5, each of the plurality of light diffusers D includes a first part D1 and a second part D2 integrated together. A projection of the first part D1 on the base substrate 10 at least partially overlaps with a projection of one of the plurality of subpixels S1 nearest to an edge of the display area on the base substrate 10. In one example, and as shown in FIG. 3 and FIG. 4, the projection of the first part D1 on the base substrate 10 substantially overlaps with the projection of the one of the plurality of subpixels S1 nearest to an edge of the display area on the base substrate 10.

Referring to FIG. 3 and FIG. 5, in some embodiments, a projection of each of the plurality of light diffusers D on the base substrate 10 partially overlaps with a projection of a single one (i.e., no more than one) of the plurality of subpixels S1 nearest to an edge of the display area on the base substrate 10. Optionally, the area of each of the plurality of light diffusers D is greater than the area of the corresponding single one of the plurality of subpixels S1 nearest to an edge of the display area. Optionally, the array of a plurality of subpixels S is arranged substantially along a first direction and a second direction. Optionally, each side of each of the plurality of subpixels S (e.g., each side of each of the plurality of subpixels S1 nearest to an edge of the display area) is parallel to one of the first direction and the second direction. Optionally, at least one side of each of the plurality of light diffusers D is not parallel to the first direction and not parallel to the second direction.

Referring to FIG. 3 and FIG. 5, in some embodiments, a projection of the second part D2 on the base substrate 10 extends outside the projection of the one of the plurality of subpixels S1 nearest to the edge of the display area on the base substrate 10. Light emitted from each of the plurality of subpixels S1 nearest to an edge of the display area transmits into a corresponding one of the plurality of light diffusers D, specifically, into the first part D1 of the corresponding one of the plurality of light diffusers D. Each of the plurality of light diffusers D is configured to diffuse light emitted from the one of the plurality of subpixels S1 nearest to the edge of the display area. As shown in FIG. 5, a portion of diffused light emits out of the each of the plurality of light diffusers D from the second part D2. By having this structure, the area of each of the plurality of subpixels S1 nearest to the edge of the display area is effectively enlarged. The display area is increased to include the area corresponding to the plurality of light diffusers D.

Figure 6:
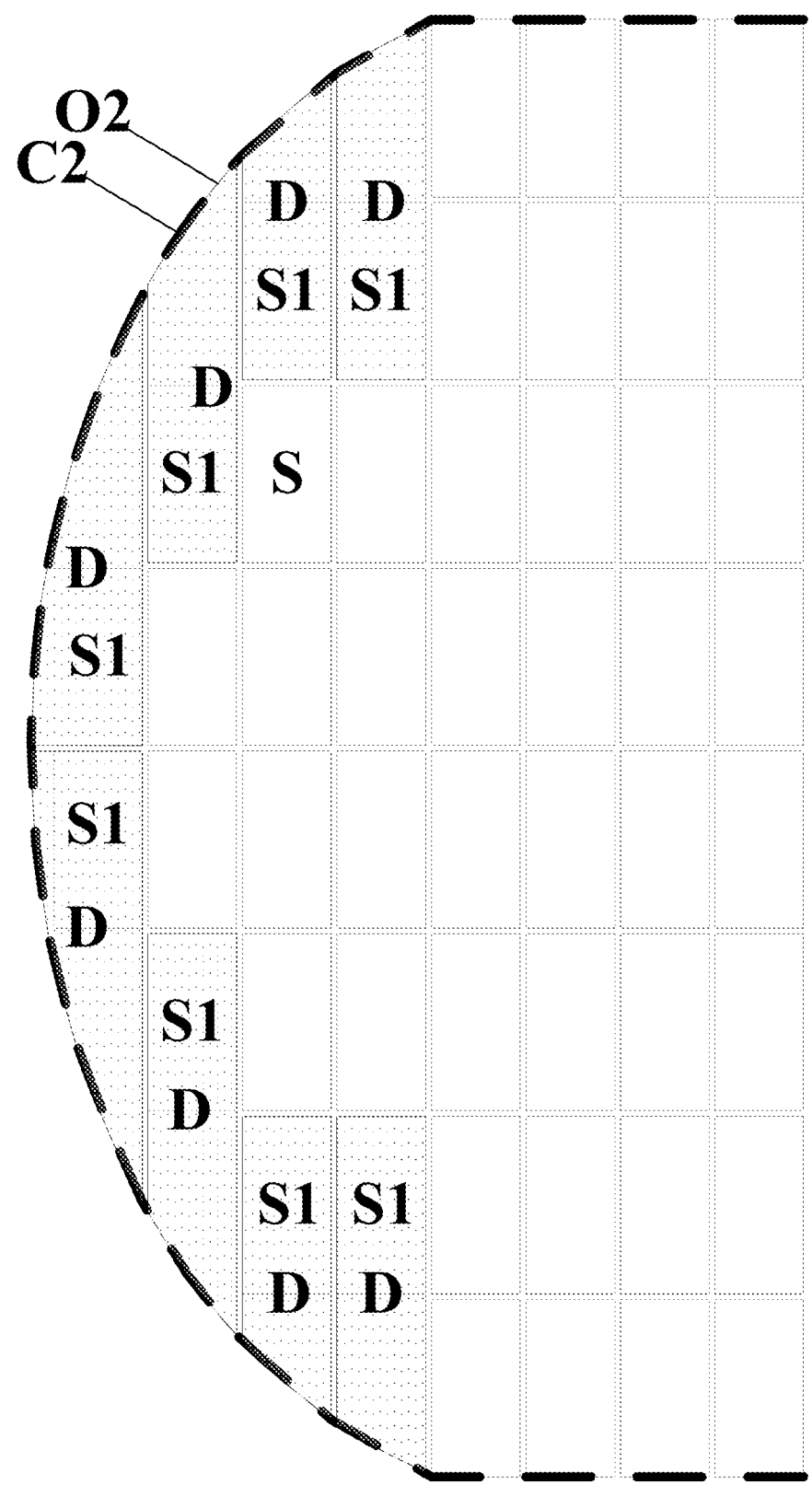
FIG. 6 is a diagram illustrating a portion of a display panel in some embodiments according to the present disclosure.

FIG. 6 is a diagram illustrating a portion of a display panel in some embodiments according to the present disclosure. Referring to FIG. 1, in some embodiments, the plurality of subpixels S along the edge of the display area (e.g., the plurality of subpixels S1 nearest to the edge of the display area) in at least a first region form a serrated exterior contour. Referring to FIG. 6, the plurality of light diffusers D nearest to the edge of the display area in the at least the first region form a substantially smooth exterior contour C2, e.g., a substantially smoothly curved contour as shown in FIG. 6. In some embodiments, and as shown in FIG. 6, the substantially smooth exterior contour C2 substantially overlaps with an outline O2 of the display area. In FIG. 6, the display area is an area of the display panel where image is actually displayed, including the area occupied by the plurality of light diffusers D.

Figure 7:
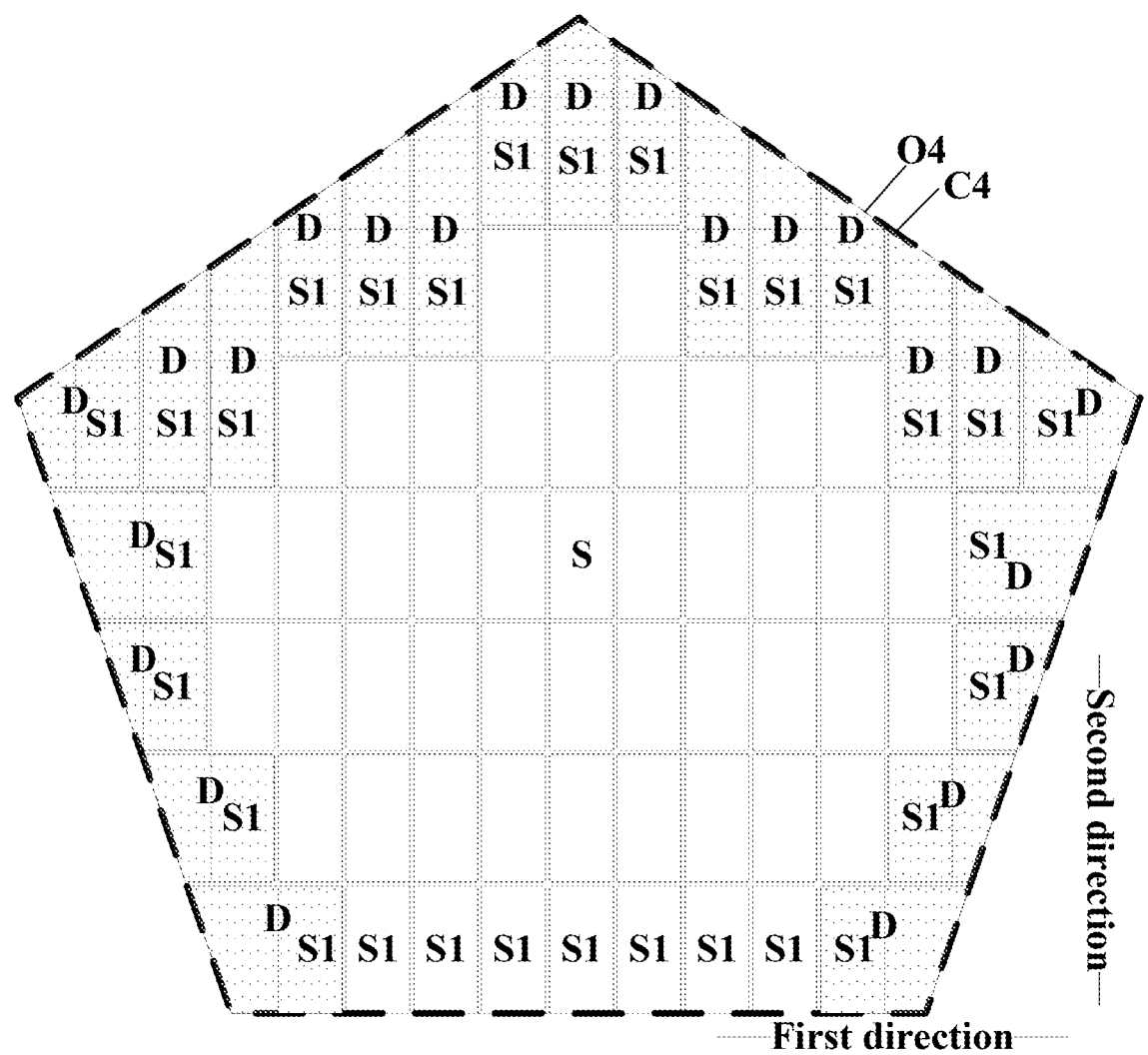
FIG. 7 is a diagram illustrating a portion of a display panel in some embodiments according to the present disclosure.

FIG. 7 is a diagram illustrating a portion of a display panel in some embodiments according to the present disclosure. Referring to FIG. 2, in some embodiments, the plurality of subpixels S along the edge of the display area (e.g., the plurality of subpixels S1 nearest to the edge of the display area) in at least a first region form a serrated exterior contour C3. Referring to FIG. 7, in some embodiments, the plurality of light diffusers D nearest to the edge of the display area in the at least the first region form a substantially smooth exterior contour C4. The substantially smooth exterior contour C4 is a substantially straight line as shown in FIG. 7. In some embodiments, and as shown in FIG. 7, the substantially smooth exterior contour C4 substantially overlaps with an outline C4 of the display area. In FIG. 7, the display area is an area of the display panel where image is actually displayed, including the area occupied by the plurality of light diffusers D.

Accordingly, the present disclosure provides a display panel having an array of a plurality of subpixels arranged substantially along a first direction and a second direction. In some embodiments, at least a portion of an outline of the display panel extends along a direction non-parallel to the first direction and non-parallel to the second direction. Optionally, the plurality of light diffusers are arranged along the outline non-parallel to the first direction and non-parallel to the second direction. The plurality of light diffusers form a substantially smooth exterior contour. Optionally, the substantially smooth exterior contour formed by the plurality of light diffusers substantially overlaps with the outline of the display panel.

The display panel may have various appropriate shapes. Optionally, the shape of the display panel is non-rectangular and non-square. Optionally, the outline of the display panel includes a portion of a round shape. In one example, the display panel is a circular display panel. Optionally, the outline of the display panel includes a portion of an arc shape. Optionally, the outline of the display panel includes a portion of a polygonal shape, e.g., a pentagonal shape, a hexagonal shape, an octagonal shape, and so on.

Various appropriate light diffusing materials may be used for making the light diffusion layer. Exemplary methods of preparing light diffusion layer include a matte treatment and a bead treatment. In one example, a layer (e.g., a polymer layer) undergoes a matte treatment to impart a haze on the layer. Optionally, the light diffusion layer has a haze level of at least 20%, e.g., at least 40%, at least 60%, and at least 80%. In another example, the layer (e.g., a polymer layer) undergoes a bead treatment to gain light diffusing function.

In some embodiments, the light diffusion layer includes a body being substantially transparent and a light diffusing agent dispersed in the body. Optionally, the body includes a polymer material. Optionally, the light diffusing agent includes a plurality of light diffusing particles (e.g., beads). The light diffusing agent may include a polymer. Optionally, the light diffusing agent includes an inorganic material. Optionally, the light diffusing agent is made of one or a combination of silicon oxide, poly ethylene propylene, a silicone resin, an acrylic resin, an epoxy resin, a styrene resin, titanium (IV) oxide ($TiO_2$), zinc oxide (ZnO), barium sulfate ($BASO_4$), calcium sulfate ($CaSO_4$), magnesium carbonate ($MgCO_3$) and aluminum hydroxide ($Al(OH)_3$).

In some embodiments, the body is made of one or a combination of a polymer material such as polycarbonate and polmethyl methacrylate.

Optionally, the display panel is a liquid crystal display panel.

Optionally, the display panel is an organic light emitting diode display panel including a plurality of organic light emitting diodes.

Figure 8:
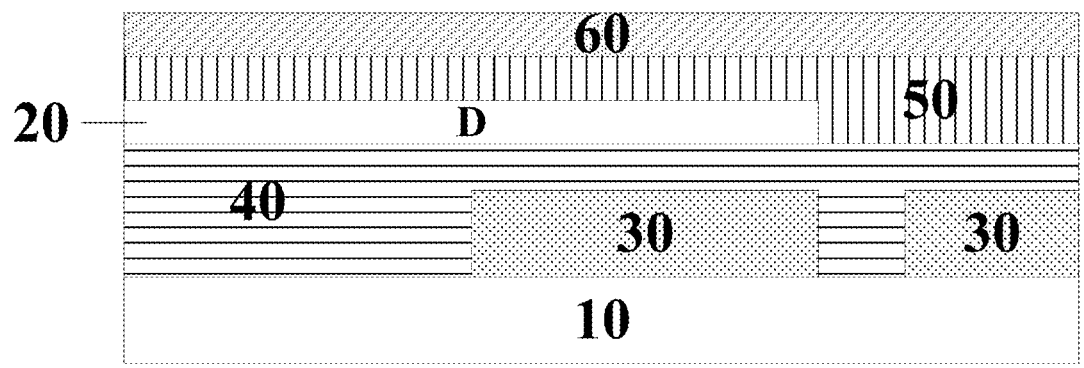
FIG. 8 is a diagram illustrating the structure of a display panel in some embodiments according to the present disclosure.

FIG. 8 is a diagram illustrating the structure of a display panel in some embodiments according to the present disclosure. Referring to FIG. 8, the display panel in some embodiments includes a plurality of organic light emitting diodes 30 on the base substrate 10, an encapsulating layer 40 on a side of the plurality of organic light emitting diodes 30 distal to the base substrate 10, a light diffusion layer 20 on a side of the encapsulating layer 40 distal to the base substrate 10. Optionally, the light diffusion layer 20 is in contact with the encapsulating layer 40.

Figure 9:
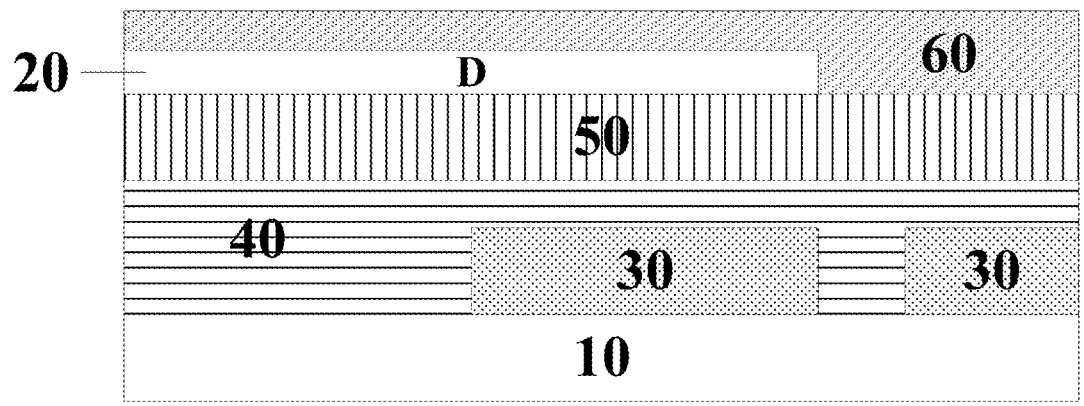
FIG. 9 is a diagram illustrating the structure of a display panel in some embodiments according to the present disclosure.

FIG. 9 is a diagram illustrating the structure of a display panel in some embodiments according to the present disclosure Referring to FIG. 9, the display panel in some embodiments includes a plurality of organic light emitting diodes 30 on the base substrate 10, an encapsulating layer 40 on a side of the plurality of organic light emitting diodes 30 distal to the base substrate 10, an optically clear resin layer 50 on a side of the encapsulating layer 40 distal to the base substrate 10, and a light diffusion layer 20 on a side of the optically clear resin 50 distal to the base substrate 10. Optionally, the light diffusion layer 20 is in contact with the optically clear resin layer 50.

Figure 10:
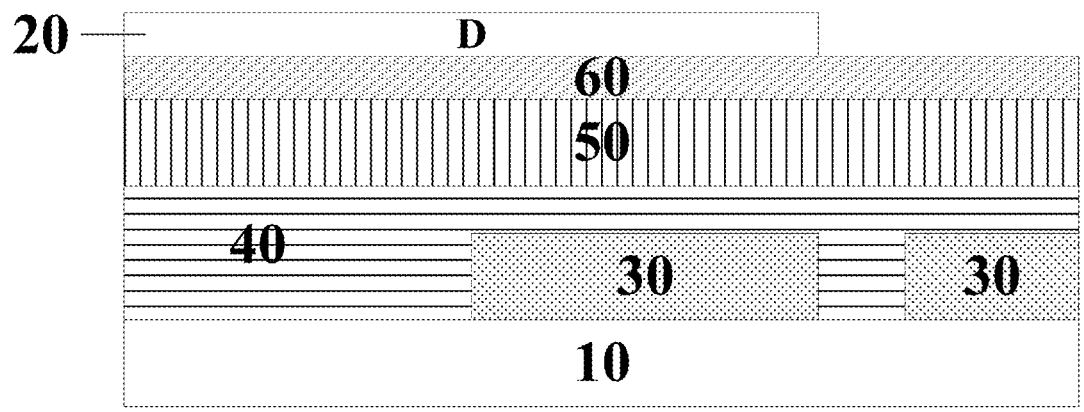
FIG. 10 is a diagram illustrating the structure of a display panel in some embodiments according to the present disclosure.

FIG. 10 is a diagram illustrating the structure of a display panel in some embodiments according to the present disclosure. Referring to FIG. 10, the display panel in some embodiments includes a plurality of organic light emitting diodes 30 on the base substrate 10, an encapsulating layer 40 on a side of the plurality of organic light emitting diodes 30 distal to the base substrate 10, an optically clear resin layer 50 on a side of the encapsulating layer 40 distal to the base substrate 10, a cover glass 60 on a side of the optically clear resin layer 50 distal to the base substrate 10, and a light diffusion layer 20 on a side of the cover glass 60 distal to the base substrate 10. Optionally, the light diffusion layer 20 is in contact with the cover glass 60.

In another aspect, the present disclosure provides a method of fabricating a display panel having a display area and an array of a plurality of subpixels in the display area. In some embodiments, the method includes forming a light diffusion layer on a base substrate. The light diffusion layer is formed to comprise a plurality alight diffusers separated from each other. Optionally, each of the plurality of light diffusers is formed to diffuse light emitted from the one of the plurality of subpixels nearest to the edge of the display area, a portion of diffused light emits out of the each of the plurality of light diffusers outside a region corresponding to the one of the plurality of subpixels nearest to the edge of the display area.

In some embodiments, each of the plurality of light diffusers is formed to include a first part and a second part integrated together. Optionally, a projection of the first part on the base substrate at least partially overlaps with a projection of one of the plurality of subpixels nearest to an edge of the display area on the base substrate. Optionally, the projection of the first part on the base substrate substantially overlaps with the projection of the one of the plurality of subpixels nearest to an edge of the display area on the base substrate. Optionally, a projection of the second part on the base substrate extends outside the projection of the one of the plurality of subpixels nearest to the edge of the display area on the base substrate. Optionally, each of the plurality of light diffusers is configured to diffuse light emitted from the one of the plurality of subpixels nearest to the edge of the display area, a portion of diffused light emits out of the each of the plurality of light diffusers from the second part. Optionally, a projection of each of the plurality of light diffusers partially on the base substrate overlaps with a projection of a single one of the plurality of subpixels nearest to an edge of the display area on the base substrate.

In some embodiments, the plurality of subpixels along the edge of the display area in at least a first region form a serrated exterior contour. Optionally, the light diffusion layer is formed so that a plurality of light diffusers nearest to the edge of the display area in the at least the first region form a substantially smooth exterior contour. Optionally, the substantially smooth exterior contour is a substantially smoothly curved contour. Optionally, the substantially smooth exterior contour is a substantially straight-line.

In some embodiments, the array of a plurality of subpixels is arranged substantially along a first direction and a second direction. Optionally, at least a portion of an outline of the display panel extends along a direction non-parallel to the first direction and non-parallel to the second direction. Optionally, the plurality of light diffusers are formed to be arranged along the outline. Optionally, an outline of the display panel comprises a portion of a round shape. Optionally, an outline of the display panel comprises a portion of an arc shape. Optionally, an outline of the display panel comprises a portion of a polygonal shape.

In another aspect, the present disclosure provides a display apparatus having a display panel described herein or fabricated by a method described herein. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all teens are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a display area and an array of a plurality of subpixels in the display area, comprising:
   a base substrate; and
   a light diffusion layer on the base substrate and comprising a plurality of light diffusers separated from each other;
   wherein each of the plurality of light diffusers is configured to diffuse light emitted from one of the plurality of subpixels nearest to an edge of the display area, wherein a portion of diffused light emits out of each of the plurality of light diffusers outside a region corresponding to the one of the plurality of subpixels nearest to the edge of the display area.

2. The display panel of claim 1, wherein each of the plurality of light diffusers comprises a first part and a second part integrated together;
   a projection of the first part on the base substrate at least partially overlaps with a projection of one of the plurality of subpixels nearest to the edge of the display area on the base substrate;
   a projection of the second part on the base substrate extends outside the projection of the one of the plurality of subpixels nearest to the edge of the display area on the base substrate; and
   each of the plurality of light diffusers is configured to diffuse light emitted from the one of the plurality of subpixels nearest to the edge of the display area, a portion of diffused light emits out of each of the plurality of light diffusers from the second part.

3. The display panel of claim 2, wherein the projection of the first part on the base substrate substantially overlaps with the projection of the one of the plurality of subpixels nearest to an edge of the display area on the base substrate.

4. The display panel of claim 1, wherein the plurality of subpixels along the edge of the display area in at least a first region form a serrated exterior contour; and
   a plurality of light diffusers nearest to the edge of the display area in the at least the first region form a substantially smooth exterior contour.

5. The display panel of claim 4, wherein the substantially smooth exterior contour is a substantially smoothly curved contour.

6. The display panel of claim 4, wherein the substantially smooth exterior contour is a substantially straight-line.

7. The display panel of claim 1, wherein a projection of each of the plurality of light diffusers on the base substrate partially overlaps with a projection of a single one of the plurality of subpixels nearest to an edge of the display area on the base substrate.

8. The display panel of claim 1, wherein the light diffusion layer comprises a body being substantially transparent and a light diffusing agent dispersed in the body.

9. The display panel of claim 8, wherein the body comprises a polymer material; and
   the light diffusing agent comprises a plurality of light diffusing particles.

10. The display panel of claim 9, wherein the plurality of light diffusing particles are made of one or a combination of silicon oxide, poly ethylene propylene, and a silicone resin; and
    the body is made of one or a combination of polycarbonate and polymethyl methacrylate.

11. The display panel of claim 1, wherein the display panel is an organic light emitting diode display panel comprising a plurality of organic light emitting diodes.

12. The display panel of claim 11, further comprising an encapsulating layer encapsulating the plurality of organic light emitting diodes; and
    the light diffusion layer is on a side of the encapsulating layer distal to the base substrate and in contact with the encapsulating layer.

13. The display panel of claim 12, further comprising an optically clear resin layer on a side of the encapsulating layer distal to the base substrate; and
    the light diffusion layer is on a side of the optically clear resin layer distal to the base substrate and in contact with the optically clear resin layer.

14. The display panel of claim 13, further comprising a cover glass on a side of the optically clear resin layer distal to the base substrate; and
    the light diffusion layer is on a side of the cover glass distal to the base substrate and in contact with the cover glass.

15. The display panel of claim 1, wherein the display panel is a liquid crystal display panel.

16. The display panel of claim 1, wherein the array of a plurality of subpixels is arranged substantially along a first direction and a second direction;
    at least a portion of an outline of the display panel extends along a direction non-parallel to the first direction and non-parallel to the second direction; and
    the plurality of light diffusers are along the outline.

17. The display panel of claim 1, wherein an outline of the display panel comprises a portion of a round shape, or a portion of an arc shape, or a portion of a polygonal shape.

18. A display apparatus, comprising the display panel of claim 1.

19. The display apparatus of claim 18, wherein the display apparatus is a smart watch.

20. A method of fabricating a display panel having a display area and an array of a plurality of subpixels in the display area, comprising forming a light diffusion layer having a plurality of light diffusers on a base substrate;
    wherein each of the plurality of light diffusers is formed to diffuse light emitted from one of the plurality of subpixels nearest to an edge of the display area, wherein a portion of diffused light emits out of each of the plurality of light diffusers outside a region corresponding to the one of the plurality of subpixels nearest to the edge of the display area.

* * * * *